(12) United States Patent
Chenglong et al.

(10) Patent No.: US 10,804,135 B1
(45) Date of Patent: Oct. 13, 2020

(54) SEMICONDUCTOR STRUCTURE AND FORMATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Zhang Chenglong, Shanghai (CN); Cui Long, Shanghai (CN)

(73) Assignees: Semiconductor Manufacturing (Shanghai) International Corporation, Shanghai (CN); Semiconductor Manufacturing (Beijing) International Corporation, Beijing (CN)

( * ) Notice: Subject to any disclaimer, the term of this patent is extended or adjusted under 35 U.S.C. 154(b) by 0 days.

(21) Appl. No.: 16/659,932

(22) Filed: Oct. 22, 2019

(30) Foreign Application Priority Data

Jun. 28, 2019 (CN) .......................... 2019 1 0577105

(51) Int. Cl.
*H01L 21/74* (2006.01)
*H01L 23/535* (2006.01)
*H01L 29/66* (2006.01)
*H01L 29/417* (2006.01)

(52) U.S. Cl.
CPC .......... *H01L 21/743* (2013.01); *H01L 23/535* (2013.01); *H01L 29/41766* (2013.01); *H01L 29/66545* (2013.01)

(58) Field of Classification Search
CPC ............. H01L 21/743; H01L 29/66545; H01L 23/535; H01L 29/41766; H01L 29/41873; H01L 21/76843
See application file for complete search history.

(56) References Cited

U.S. PATENT DOCUMENTS

| | | | |
|---|---|---|---|
| 10,084,093 B1 * | 9/2018 | Mishra | H01L 21/76897 |
| 10,236,364 B1 * | 3/2019 | Cheng | H01L 29/0847 |
| 10,325,820 B1 * | 6/2019 | Seo | H01L 27/0924 |
| 2013/0015533 A1 * | 1/2013 | Wang | B82Y 40/00 257/390 |

(Continued)

FOREIGN PATENT DOCUMENTS

WO WO-9727623 A1 * 7/1997 .......... H01L 29/475

*Primary Examiner* — Ahmed N Sefer
(74) *Attorney, Agent, or Firm* — Brinks Gilson & Lione

(57) ABSTRACT

A semiconductor structure and a formation method thereof are provided. The formation method includes: providing a base, a dummy gate structure being formed on the base, a source/drain doping region being formed in the base on both sides of the dummy gate structure, a dielectric layer being formed on the base exposed by the dummy gate structure, and the dielectric layer covering the source/drain doping region; etching the dielectric layer on both sides of the dummy gate structure to form a contact hole exposing the source/drain doping region; forming a contact plug in the contact hole, the contact plug being electrically connected to the source/drain doping region; after forming the contact plug, removing the dummy gate structure, and forming a gate opening in the dielectric layer; and forming a gate structure in the gate opening. Embodiments of the present disclosure are advantageous to simplify process complexity and increase process windows.

13 Claims, 7 Drawing Sheets

(56) References Cited

U.S. PATENT DOCUMENTS

| | | | |
|---|---|---|---|
| 2014/0175527 A1* | 6/2014 | Chang | H01L 29/6656 |
| | | | 257/288 |
| 2015/0380558 A1* | 12/2015 | Huang | H01L 29/66795 |
| | | | 257/288 |
| 2016/0358916 A1* | 12/2016 | Adusumilli | H01L 27/092 |
| 2017/0186692 A1* | 6/2017 | Zhao | H01L 21/0214 |
| 2017/0186867 A1* | 6/2017 | Pan | H01L 21/823807 |
| 2018/0047632 A1* | 2/2018 | Zhang | H01L 21/76816 |
| 2018/0096845 A1* | 4/2018 | Lee | H01L 21/02661 |
| 2018/0130704 A1* | 5/2018 | Li | H01L 21/02164 |
| 2019/0371898 A1* | 12/2019 | Huang | H01L 21/31138 |

\* cited by examiner

SEMICONDUCTOR STRUCTURE AND FORMATION METHOD THEREOF

RELATED APPLICATIONS

The present application claims priority to Chinese Patent Appln. No. 201910577105.6, filed Jun. 28, 2019, the entire disclosure of which is hereby incorporated by reference.

BACKGROUND

Technical Field

Embodiments and implementations of the present disclosure relate to the field of semiconductor manufacturing, and in particular, to a semiconductor structure and a formation method thereof.

Related Art

As MOSFET devices are scaled down, devices require a high dielectric constant (high k) as a gate insulating layer and metal as a stack structure of a gate conductive layer to suppress the problems of high gate leakage and reduced gate capacitance due to polysilicon gate depletion problems. In order to more effectively control the profile of a gate stack, a gatelast process is generally used in the industry. That is, a dummy gate made of polysilicon or the like is usually deposited on a substrate. After an interlayer dielectric layer (ILD) is deposited, the dummy gate is removed, and then a stack of high-k metal gate (HK/MG) layers is filled in a reserved gate trench. Thereafter, the ILD is etched to form a contact hole exposing a source/drain doping layer, and a metal material is deposited in the contact hole to form a contact plug.

However, as device integration increases, device feature sizes continue to shrink, and gate lengths and source/drain region sizes are scaled down. When a size of the source/drain doping layer is small, it poses a great challenge to a contact process. This is mainly reflected in high requirements for the critical dimensions (CD) and overlay of photoetching. For example, in order to reduce the series resistance of a contact itself, it is required that the size of a contact hole is substantially close to the size of a source/drain region. If the size of the contact hole is significantly smaller than the size of the source/drain region (especially a heavily doped source/drain doping layer), this requires a higher critical dimension for photoetching, while the series resistance of the smaller contact plug itself will be larger. In addition, since a distance between the contact hole and a gate is reduced, the overlay of contact hole photoetching is required to be high. If the overlay is large, a short circuit between the contact plug and the gate is caused.

SUMMARY

Embodiments and implementations of the present disclosure are directed to a semiconductor structure and a method for forming a semiconductor structure, which simplify process complexity and increase process windows.

To address the aforementioned problems, embodiments and implementations of the present disclosure provide a method for forming a semiconductor structure. In one form, a method for forming a semiconductor structure includes: providing a base, a dummy gate structure being formed on the base, where a source/drain doping region is formed in the base on both sides of the dummy gate structure, a dielectric layer is formed on the base exposed by the dummy gate structure, and the dielectric layer covers the source/drain doping region; etching the dielectric layer on both sides of the dummy gate structure to form a contact hole exposing the source/drain doping region; forming a contact plug in the contact hole, the contact plug being electrically connected to the source/drain doping region; after forming the contact plug, removing the dummy gate structure, and forming a gate opening in the dielectric layer; and forming a gate structure in the gate opening.

The present disclosure also provides a semiconductor structure. In one form, a semiconductor structure includes: a base; a dummy gate structure, located on the base; a source/drain doping region, located in the base on both sides of the dummy gate structure; a dielectric layer, located on the base exposed by the dummy gate structure, the dielectric layer exposing a top of the dummy gate structure; and a contact plug, located in the dielectric layer on a top of the source/drain doping region, where the contact plug is electrically connected to the source/drain doping region.

Compared with the prior art, technical solutions of embodiments and implementations of the present disclosure have the following advantages:

In embodiments and implementations of the present disclosure, a dielectric layer on both sides of the dummy gate structure is etched first to form a contact hole exposing the top of the source/drain doping region in the dielectric layer, and then a contact plug is formed in the contact hole. After a gate opening is formed by removing the dummy gate structure subsequently and a gate structure is formed in the gate opening, the steps of removing the gate structure of a partial thickness and forming a protective layer on the top of the remaining gate structure are not required additionally, thereby facilitating simplification of the process complexity and reduction of the process difficulty. Moreover, the embodiments of the present disclosure eliminate the step of removing the gate structure of a partial thickness, so that it is unnecessary to form a dummy gate structure and a gate structure having an excessively large height. Accordingly, it is advantageous to increase the process windows for forming the dummy gate structure, removing the dummy gate structure and forming the gate structure. In summary, the embodiments of the present disclosure are advantageous to simplify the process complexity and increase the process windows.

DETAILED DESCRIPTION

At present, the process steps of forming a gate structure and a contact plug are complicated, and the process windows are small. A method for forming a semiconductor structure is now combined to analyze the reasons for the complicated process steps and the small process windows.

Referring to FIGS. 1-6, schematic diagrams corresponding to various steps in a method for forming a semiconductor structure are shown.

Figure 1:
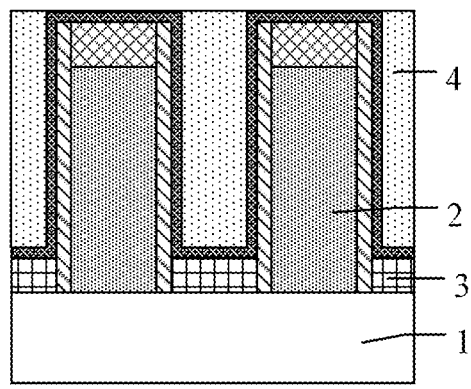
FIGS. 1-6 are schematic diagrams corresponding to various steps in a method for forming a semiconductor structure.

Referring to FIG. 1, a base 1 is provided, where a dummy gate structure 2 is formed on the base 1, a source/drain doping region 3 is formed in the base 1 on both sides of the dummy gate structure 2, a dielectric layer 4 is formed on the base 1 exposed by the dummy gate structure 2, and the dielectric layer 4 covers the source/drain doping region 3.

Figure 2:
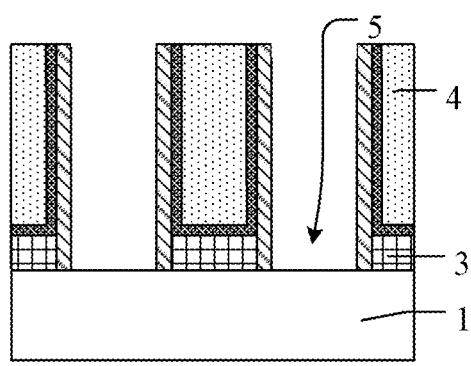

Referring to FIG. 2, the dummy gate structure 2 (as shown in FIG. 1) is removed, and a gate opening 5 is formed in the dielectric layer 4.

Figure 3:
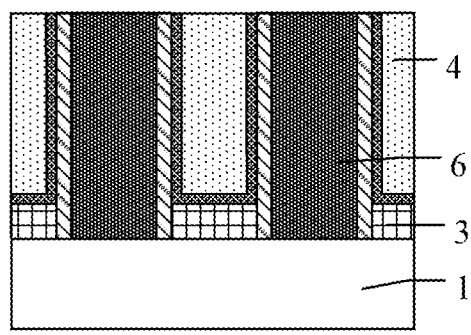

Referring to FIG. 3, a gate structure 6 is formed in the gate opening 5.

Figure 4:
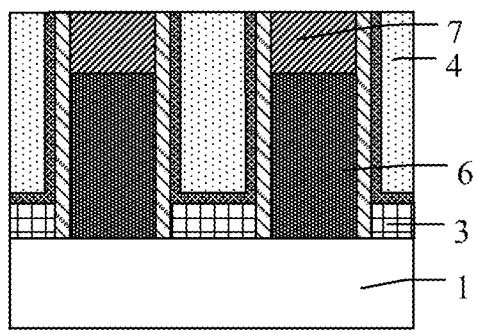

Referring to FIG. 4, the gate structure 6 of a partial thickness is etched back to form a groove (not shown) in the dielectric layer 4, and a protective layer 7 filled in the groove is formed.

Specifically, the step of forming the protective layer 7 includes: filling a protective material layer (not shown) in the groove, the protective material layer also covering the top of the dielectric layer 4; and removing the protective material layer above the top of the dielectric layer 4 by using a planarization process, the remaining protective material layer located in the groove serving as the protective layer 7.

Figure 5:
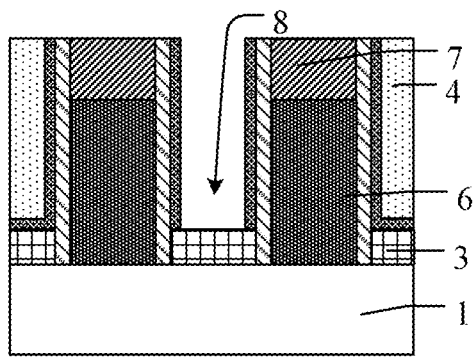

Referring to FIG. 5, a self-aligned contact (SAC) etching process is used, and the protective layer 7 is used as an etch barrier layer to etch the dielectric layers 4 on both sides of the gate structure 6 to form a contact hole 8 exposing the source/drain doping region 3.

Figure 6:
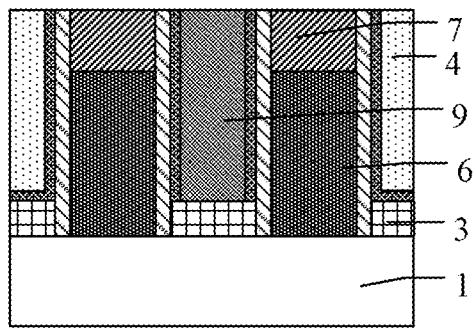

Referring to FIG. 6, a contact plug 9 is formed in the contact hole 8.

In the field of semiconductors, a side wall (not marked) is also formed on a sidewall of the gate structure 6 for protecting the sidewall of the gate structure 6 and for defining a formation region of the source/drain doping region 3. The protective layer 7 and the side wall can function to define an etch stop position in a self-aligned contact etching process for forming the contact hole 8, and therefore, even if the problem of overlay shift exists in the process of forming the contact hole 8, the etching process can be prevented from causing loss to the gate structure 6, thereby preventing the contact plug and the gate structure 5 which are subsequently filled in the contact hole 8 from being short-circuited.

However, in the formation method, it is necessary to form the dummy gate structure 2 and the gate structure 6 higher than a preset process height, which increases the process difficulty of forming and removing the dummy gate structure 2 and forming the gate structure 6. Moreover, the gate structure 6 is generally a metal gate structure, the process of etching back the gate structure 6 of a partial thickness is difficult, the process stability is low, and large side effects are easily generated. In addition, in the process of forming the protective layer 7, the formation of a protective material layer filled in the groove easily causes defects such as voids, and in the step of performing the planarization process, the removal selection of the protective material layer and the dielectric layer 4 is relatively small, it is difficult to control a stop position of the planarization process, and the difficulty of the planarization process is large. In summary, the formation method has a complicated process flow, a large process difficulty and a small process window.

To address the technical problem, embodiments and implementations of the present disclosure provide a method for forming a semiconductor structure. One form of a formation method includes: providing a base, a dummy gate structure being formed on the base, where a source/drain doping region is formed in the base on both sides of the dummy gate structure, a dielectric layer is formed on the base exposed by the dummy gate structure, and the dielectric layer covers the source/drain doping region; etching the dielectric layer on both sides of the dummy gate structure to form a contact hole exposing the source/drain doping region; forming a contact plug in the contact hole, where the contact plug is electrically connected to the source/drain doping region; after forming the contact plug, removing the dummy gate structure, and forming a gate opening in the dielectric layer; and forming a gate structure in the gate opening.

In embodiments and implementations of the present disclosure, a dielectric layer on both sides of the dummy gate structure is etched first to form a contact hole exposing the top of the source/drain doping region in the dielectric layer, and then a contact plug is formed in the contact hole. Therefore, after a gate opening is formed by subsequently removing the dummy gate structure and forming a gate structure in the gate opening, the steps of removing the gate structure of a partial thickness and forming a protective layer on the top of the remaining gate structure are not required additionally, thereby facilitating simplification of the process complexity and reduction of the process difficulty. Moreover, embodiments and implementations of the present disclosure eliminate the step of removing the gate structure of a partial thickness, so that it is unnecessary to form a dummy gate structure and a gate structure having an excessively large height. Accordingly, it is advantageous to increase the process windows for forming the dummy gate structure, removing the dummy gate structure and forming the gate structure. In summary, embodiments and implementations of the present disclosure are advantageous to simplify the process complexity and increase the process windows.

To make the above objects, features and advantages of embodiments and implementations of the present disclosure more clearly understood, specific embodiments and implementations of the present disclosure are described in detail below with reference to the accompanying drawings.

FIGS. 7-17 are schematic diagrams corresponding to various steps in one form of a method for forming a semiconductor structure according to the present disclosure.

Figure 7:
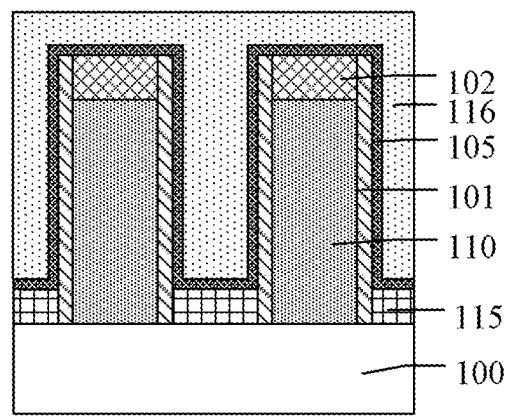
FIGS. 7-17 are schematic diagrams corresponding to various steps in one form of a method for forming a semiconductor structure according to the present disclosure.

Referring to FIG. 7, a base 100 is provided, a dummy gate structure 110 is formed on the base 100, a source/drain doping region 115 is formed in the base 100 on both sides of the dummy gate structure 110, a dielectric layer 116 is formed on the base 100 exposed by the dummy gate structure 110, and the dielectric layer 116 covers the source/drain doping region 115.

The base 100 is used to provide a process platform for subsequent processes.

In some implementations, the base 100 is used to form a planar field effect transistor, and the base 100 accordingly includes only a substrate (not marked). In other implementations, when the base is used to form a fin field effect transistor (FinFET), the base accordingly includes a substrate and a fin that protrudes from the substrate.

In some implementations, the substrate is a silicon substrate. In other implementations, the material of the substrate may also be other materials such as germanium, silicon germanide, silicon carbide, gallium arsenide or indium gallide, and the substrate can also be other types of substrates such as a silicon substrate on an insulator or a germanium substrate on an insulator. The material of the substrate may be a material suitable for process requirements or easy to integrate.

The dummy gate structure 110 occupies a spatial position for subsequent formation of a gate structure.

In some implementations, the dummy gate structure 110 is a single-layer structure, the dummy gate structure 110 includes only a dummy gate layer (not marked), and the material of the dummy gate layer is polysilicon.

In other implementations, the dummy gate structure may also be a stacked structure, the dummy gate structure accordingly includes a dummy gate oxide layer and a dummy gate layer located on the dummy gate oxide layer, and the material of the dummy gate oxide layer may be silicon oxide or silicon oxynitride.

In some implementations, a gate mask layer 102 is further formed on the top of the dummy gate structure 110.

The gate mask layer 102 is located on the top of the dummy gate structure 110, the gate mask layer 102 is used as an etch mask when the dummy gate structure 110 is formed, and the gate mask layer 102 is also used to protect the top of the dummy gate structure 110. Therefore, the position, shape and number of the gate mask layer 102 correspond to the position, shape and number of the dummy gate structure 110.

In some implementations, the gate mask layer 102 is also used as an etch barrier layer during the subsequent formation of a contact hole, thereby defining a stop position of the self-aligned etching process.

The material of the gate mask layer 102 includes one or more of silicon nitride, silicon carbide and silicon carbonitride. In some implementations, the material of the gate mask layer 102 is silicon nitride. The silicon nitride material has a relatively large density and hardness, which accordingly increase the mechanical strength of the gate mask layer 102, thereby improving the etching mask function of the gate mask layer 102 and the function of defining the stop position of the subsequent self-aligned etching process.

In some implementations, a side wall layer 101 is further formed on the sidewall of the dummy gate structure 110. The side wall layer 101 is used to define a formation region of the source/drain doping region 115, and the side wall layer 101 is further used to protect the dummy gate structure 110 and the sidewall of the subsequently formed gate structure in subsequent processes.

The material of the side wall layer 101 may be at least one of silicon oxide, silicon nitride, silicon oxynitride, silicon carbide, silicon oxycarbonitride, silicon oxycarbide, boron nitride or boron oxycarbide. The side wall layer 101 may be a single-layer structure or a stacked structure. In some implementations, the side wall layer 101 is a single-layer structure, and the material of the side wall layer 101 is silicon nitride.

The source/drain doping region 115 is located in the base 100 on both sides of the dummy gate structure 110.

When an NMOS transistor is formed, the source/drain doping region 115 includes a stress layer doped with an N-type ion, the material of the stress layer is Si or SiC, and the stress layer provides a tensile stress to a channel region of the NMOS transistor, thereby facilitating the increase of the carrier mobility of the NMOS transistor, where the N-type ion is a P ion, an As ion or an Sb ion.

When a PMOS transistor is formed, the source/drain doping region 115 includes a stress layer doped with a P-type ion, the material of the stress layer is Si or SiGe, and the stress layer provides a pressure stress to a channel region of the PMOS transistor, thereby facilitating the increase of the carrier mobility of the PMOS transistor, where the P-type ion is a B ion, a Ga ion or an In ion.

In some implementations, a contact etch stop layer (CESL) 105 is also formed on the base 100 to conformally cover the source/drain doping region 115, the sidewall of the side wall layer 101 and the top of the gate mask layer 102. Accordingly, the dielectric layer 116 covers the contact etch stop layer 105.

The contact etch stop layer 105 located on the top of the source/drain doping region 115 is used to define a stop position in a subsequent contact etch process, thereby reducing the damage of the contact etch process to the source/drain doping region 115. The contact etch stop layer 105 located on the sidewall of the side wall layer 101 and the side wall layer 101 form a side wall structure, thereby protecting the sidewall of the dummy gate structure 110. The contact etch stop layer 105 located on the gate mask layer 102 is used to protect the top of the dummy gate structure 110 together with the gate mask layer 102.

In some implementations, the material of the contact etch stop layer 105 is silicon nitride. The silicon nitride material has a relatively large density and hardness, so as to ensure that the contact etch stop layer 105 can achieve the functions of defining an etch stop position in a subsequent contact etch process and protecting the dummy gate structure 110.

In some implementations, in the step of providing the base 100, the dielectric layer 116 covers the sidewall of the dummy gate structure 110, and the dielectric layer 116 also covers the gate mask layer 102. Specifically, the dielectric layer 116 covers the contact etch stop layer 105 located on the top of the gate mask layer 102.

The dielectric layer 116 is used to isolate adjacent devices, and the dielectric layer 116 also provides a process platform for forming a contact plug 120 and subsequently forming a gate structure.

Therefore, the material of the dielectric layer 116 is an insulating material such as one or more of silicon oxide, silicon nitride, silicon oxynitride, silicon oxycarbide, carbonitride and silicon oxycarbonitride. In some implementations, the material of the dielectric layer 116 is silicon oxide.

Figure 8:
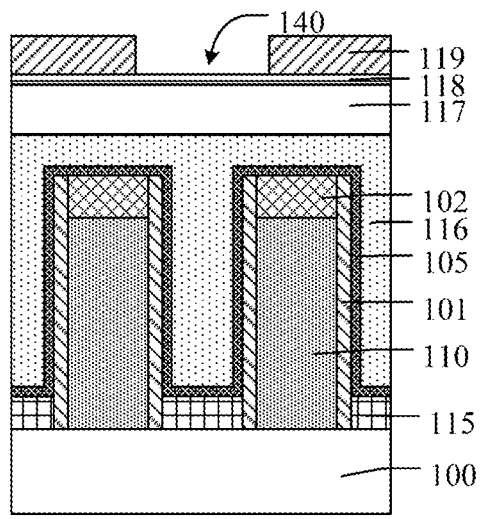
Figure 9:
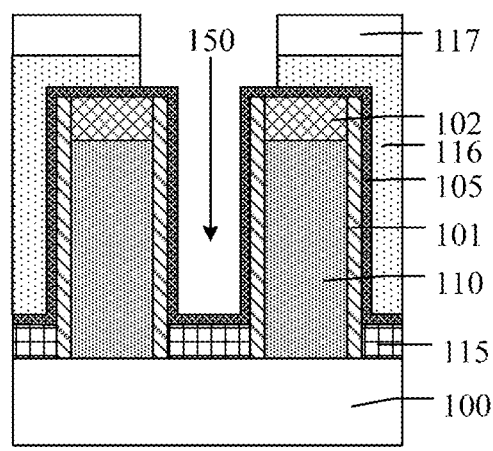
Figure 10:
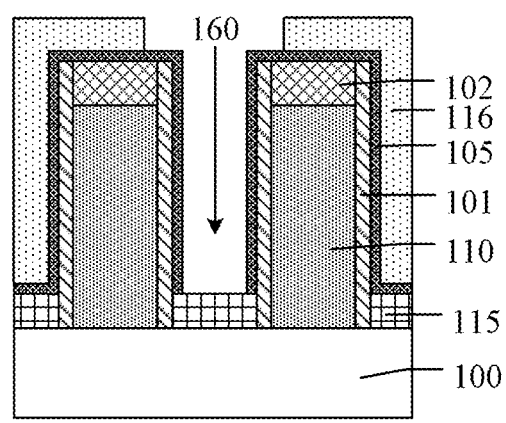

Referring to FIG. 8 to FIG. 10, the dielectric layer 116 on both sides of the dummy gate structure 110 are etched to form a contact hole 160 exposing the source/drain doping region 115 (as shown in FIG. 10).

The contact hole 160 provides a spatial position for subsequent formation of a contact plug.

In some implementations, a contact hole 160 exposing the top of the source/drain doping region 115 is formed, and the subsequent process further includes: forming a contact plug in the contact hole 160. Therefore, after a gate opening is formed by subsequently removing the gate mask layer 102 and the dummy gate structure 110 and forming a gate structure in the gate opening, the steps of removing the gate structure of a partial thickness and forming a protective layer on the top of the remaining gate structure are not required additionally, thereby facilitating simplification of the process complexity and reduction of the process difficulty. Moreover, the step of removing the gate structure of a partial thickness is eliminated, so that it is unnecessary to form a dummy gate structure 110 and a gate structure having an excessively large height. Accordingly, it is advantageous to increase the process windows for forming the dummy gate structure 110, removing the dummy gate structure 110 and forming the gate structure. In summary, in some implementations it is advantageous to simplify the process complexity and increase the process windows.

In some implementations, a gate mask layer 102 is formed on the top of the dummy gate structure 110. Therefore, through a self-aligned contact etch process, the gate mask layer 102 is used as an etch barrier layer to etch the dielectric layer 116 on both sides of the dummy gate structure 110, and a contact hole 160 exposing the top of the source/drain doping layer 115 is formed in the dielectric layer 116, thereby further improving the process window for forming the contact hole 160.

Specifically, in some implementations, the step of forming the contact hole 160 includes the following steps:

As shown in FIG. 8, a pattern layer 119 is formed on the dielectric layer 116, a pattern opening 140 exposing the top of the dielectric layer 116 above the source/drain doping region 115 is formed in the pattern layer 119, and the pattern opening 140 also extending above the partial top of the gate mask layer 102 in a direction perpendicular to a sidewall of the dummy gate structure 110.

The pattern layer 119 is used as an etch mask for subsequently etching the dielectric layer 116 to form a contact hole.

The pattern opening 140 also extends above the partial top of the gate mask layer 102, thereby reducing the process difficulty of forming the pattern opening 140, and facilitating increase of the process window for forming the pattern opening 140.

In some implementations, the material of the pattern layer 119 is a photoresist. The step of forming the pattern layer 119 may accordingly include: forming a photoresist layer (not shown) on the dielectric layer 116, and patterning the photoresist layer by using processes such as exposure and development to form the pattern layer 119.

In some implementations, before forming the pattern layer 119, the method further includes: forming a planar layer 117 (as shown in FIG. 8) on the top of the dielectric layer 116, and forming an anti-reflective coating 118 (as shown in FIG. 8) on the planar layer 117. The pattern layer 119 is accordingly formed on the anti-reflective coating 118.

The planar layer 117 is used to provide a planar surface for forming the pattern layer 119, thereby improving the pattern precision of the pattern layer 119 such that the profile, size, and formation position of the pattern layer 119 satisfy the process requirements. In some implementations, the material of the planar layer 117 is a spin on carbon (SOC) material.

In other implementations, the material of the planar layer may also be an organic dielectric layer (ODL) material or a deep UV light absorbing oxide (DUO) material.

The anti-reflective coating 118 is used to reduce the reflection effect at the time of exposure, thereby improving the transfer precision of a pattern. In some implementations, the anti-reflective coating 118 is a silicon-anti reflective coating (Si-ARC) layer, where the Si-ARC layer is advantageous to increase the exposure depth of field (DOF) during the photoetching process, and advantageous to improve the uniformity of exposure. Moreover, the Si-ARC layer is rich in silicon, so that it is also advantageous to increase the hardness of the anti-reflective coating 118, thereby facilitating further improvement of the transfer precision of a pattern.

In other implementations, the anti-reflective coating may also be other suitable anti-reflective materials, such as bottom anti-reflective coating (BARC) materials.

As shown in FIG. 9 and FIG. 10, the dielectric layer 116 exposed by the pattern opening 140 (as shown in FIG. 8) is etched by using the pattern layer 119 (as shown in FIG. 8) as a mask.

In some implementations, in the step of etching the dielectric layer 116 exposed by the pattern opening 140, the gate mask layer 102 serves as an etch barrier layer, and can function to define an etch stop position, thereby preventing damage to the top of the dummy gate structure 110 by the etching process.

It is also to be noted that in the step of etching the dielectric layer 116 exposed by the pattern opening 140, the side wall layer 101 and the contact etch stop layer 105 located on the sidewall of the side wall layer 101 can achieve an etch barrier function, thereby preventing damage to the sidewall of the dummy gate structure 110 by the etching process.

Specifically, the step of forming the contact hole 160 includes: etching, as shown in FIG. 9, the dielectric layer 116 on the top of the source/drain doping region 115, using the pattern layer 119 as a mask, to form an initial contact hole 150, where the bottom of the initial contact hole 150 exposes the contact etch stop layer 105 located on the top of the source/drain doping region 115; and removing, as shown in FIG. 10, the contact etch stop layer 105 exposed by the bottom of the initial contact hole 150 to form the contact hole 160 penetrating the dielectric layer 116 and the contact etch stop layer 105.

In some implementations, a planar layer 117 and an anti-reflective coating 118 are further formed on the dielectric layer 116. Therefore, before the dielectric layer 116 on the top of the source/drain doping region 115 is etched, the anti-reflective coating 118 and the planar layer 117 are etched using the pattern layer 119 as a mask.

In some implementations, the dielectric layer 116 on both sides of the dummy gate structure 110 is etched by a dry etching process. The dry etching process is easy to achieve anisotropic etching, and the profile control is better, which is advantageous for the profile of the initial contact hole 150 to satisfy the process requirements.

It is to be noted that, in some implementations, in the step of etching the dielectric layer 116, the pattern layer 119 and the anti-reflective coating 118 also generate losses. Therefore, only the planar layer 117 remains on the top of the dielectric layer 116 after the initial contact hole 150 is formed.

In some implementations, the contact etch stop layer 105 exposed by the bottom of the initial contact hole 150 is removed by a dry etching process. The dry etching process is easy to achieve anisotropic etching, to reduce the loss of the contact etch stop layer 105 on the sidewall of the side wall layer 101.

In other implementations, the contact etch stop layer exposed by the bottom of the initial contact hole may also be removed by a wet etching process according to actual processes.

It is also to be noted that, in some implementations, after removing the contact etch stop layer 105 exposed by the bottom of the initial contact hole 150, the method further includes: removing the planar layer 117. Specifically, the planar layer 117 may be removed by an ashing process.

It is to be noted that, some implementations are exemplified by the contact hole 160 being formed by a self-aligned contact etching process. In other implementations, the contact hole may also be formed by a non-SAC etching process according to process requirements. That is, the pattern opening is located in the dielectric layer on both sides of the dummy gate structure.

Figure 11:
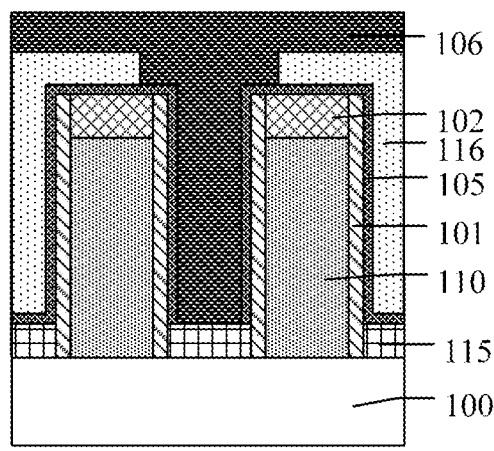
Figure 12:
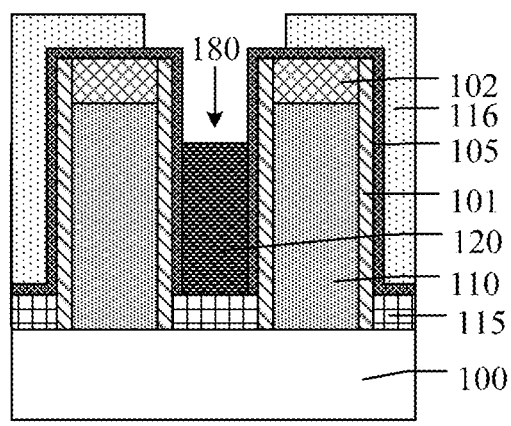

Referring to FIG. 11 and FIG. 12, a contact plug 120 (shown in FIG. 12) is formed in the contact hole 160 (shown in FIG. 10), where the contact plug 120 is electrically connected to the source/drain doping region 115.

The contact plug 120 is used to achieve an electrical connection between the source/drain doping region 115 and an external circuit or other interconnect structures.

In some implementations, the material of the contact plug 120 is W. In other implementations, the material of the contact plug may also be Al, Cu or TiAl.

In some implementations, in the step of providing the base 100, the dielectric layer 116 covers the top of the dummy gate structure 110. Specifically, the dielectric layer 116 covers the gate mask layer 102 on the top of the dummy gate structure 110.

In some implementations, the step of forming the contact plug 120 includes the following steps:

As shown in FIG. 11, a conductive layer 106 filled in the contact hole 160 is formed, where the conductive layer 106 also covers the top of the dielectric layer 116.

The conductive layer 106 is used to form the contact plug 120.

In some implementations, the conductive layer 106 is formed by a chemical vapor deposition process.

As shown in FIG. 12, the conductive layer 106 above the top of the dielectric layer 116 is removed by a planarization process. After the planarization process, the remaining conductive layer 106 of a partial thickness is etched back, and the remaining conductive layer 106 in the contact hole 160 is retained as the contact plug 120.

The conductive layer 106 above the top of the dielectric layer 116 is removed by a planarization process to improve the flatness and height uniformity of the top surface of the remaining conductive layer 106 after the planarization process, and further improve the top flatness and height uniformity of the contact plug 120.

Specifically, the planarization process may be performed by using a chemical mechanical grinding process.

In some implementations, the remaining conductive layer 106 of a partial thickness is etched back by using a dry etching process. The dry etching process is used to accurately control the etching amount of the conductive layer 106, so that the height of the contact plug 120 satisfies the process requirements, and the dry etching process is advantageous to improve the etching efficiency.

In some implementations, in the step of forming the contact plug 120, the top of the contact plug 120 is lower than the top of the dummy gate structure 110, so as to provide a process basis for subsequently forming a protective layer on the top of the contact plug 120.

Therefore, after the contact plug 120 is formed, the adjacent dummy gate structure 110 and the contact plug 120 define a groove 180 (as shown in FIG. 12).

Figure 13:
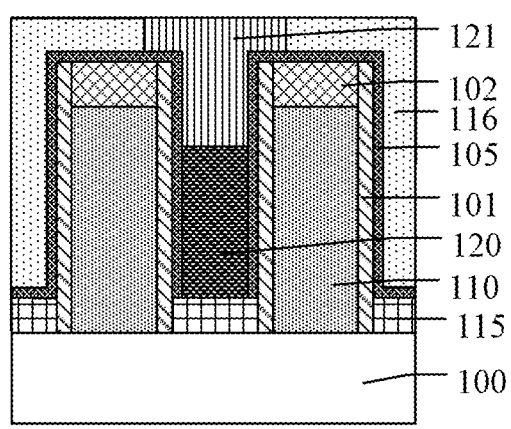
Figure 14:
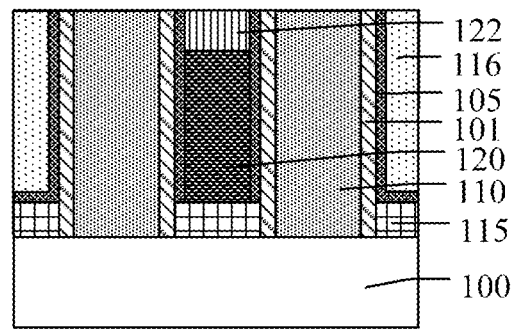

Accordingly, with reference to FIG. 13 and FIG. 14, the formation method further includes: forming a protective layer 122 (as shown in FIG. 12) on the top of the contact plug 120.

The protective layer 122 is used to protect the top of the contact plug 120, so as to prevent loss of the contact plug 120 in the subsequent steps of removing the dummy gate structure 110 to form a gate opening and forming a gate structure in the gate opening, thereby being advantageous to prevent the contact plug 120 from bridging with the subsequent gate structure.

Specifically, the protective layer 122 is formed in the groove 180.

In some implementations, the material of the protective layer 122 is silicon oxide. Specifically, the material of the protective layer 122 may include tetraethoxysilane (TEOS) or flowable chemical vapor deposition (FCVD) silicon oxide.

Silicon oxide is a commonly used material in a semiconductor process, which is advantageous to improve process compatibility and achieve low process cost. The subsequent process generally further includes the step of etching the protective layer 122 to expose the contact plug 120. The etching process is easily performed by selecting silicon oxide.

It is to be noted that the thickness of the protective layer 122 should not be too small or too large. If the thickness of the protective layer 122 is too small, the protective layer 122 is easily consumed prematurely, thereby easily reducing the protective effect of the protective layer 122 on the contact plug 120. If the thickness of the protective layer 122 is too large, the method further subsequently includes the step of etching the protective layer 122 to expose the contact plug 120. The process of etching the protective layer 122 is difficult accordingly. Moreover, the thickness of the protective layer 122 is too large, and the height of the contact plug 120 will be too small accordingly, thereby easily affecting the performance of the contact plug 120. To this end, in the step of forming the protective layer 122 in some implementations, the protective layer 122 has a thickness of 150 A to 500 A.

In some implementations, in the step of forming the protective layer 122, the top of the protective layer 122 is flush with the top of the dummy gate structure 110, thereby providing a planar surface for subsequent processes, and further improving the process stability of subsequent processes.

In some implementations, the step of forming the protective layer 122 includes the following steps:

As shown in FIG. 13, a protective material layer 121 is formed and filled in the remaining contact hole 180 exposed by the contact plug 120.

The protective material layer 121 is used to form the protective layer 122.

In some implementations, the protective material layer 121 is formed by a spin process. The top surface flatness of the protective material layer 121 is improved by a spin process. Moreover, due to the spin process, the step of removing the protective material layer above the top of the dielectric layer is not required, which is advantageous to simplify the process steps.

In other implementations, the protective material layer may also be formed by using a flowable chemical vapor deposition process.

As shown in FIG. 14, the protective material layer 121 above the top of the dummy gate structure 110 is removed by using a planarization process, and the protective material layer 121 remains as the protective layer 122.

Specifically, the planarization process is a chemical mechanical grinding process or a dry etching process.

In some implementations, the planarization process is performed by a chemical mechanical grinding process, and the protective material layer 121 is easily ground by using the top of the dummy gate structure 110 as a stop position.

In some implementations, in the step of the planarization process, the dielectric layer 116 above the top of the dummy gate structure 110 is removed, and the top of the dummy gate structure 110 is exposed to make preparations for subsequently removing the dummy gate structure 110.

In the step of the planarization process, the gate mask layer 102, the dielectric layer 116, the contact etch stop layer 106 and the side wall layer 101 above the top of the dummy gate structure 110 are also removed.

Figure 15:
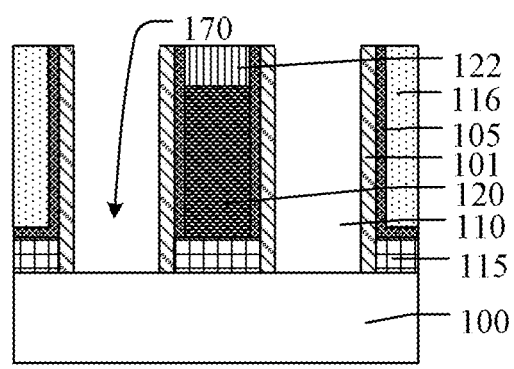

Referring to FIG. 15, after the contact plug 120 is formed, the dummy gate structure 110 (as shown in FIG. 14) is removed, and a gate opening 170 is formed in the dielectric layer 116.

The gate opening 170 provides a spatial position for subsequent formation of a gate structure.

In some implementations, in the step of forming the protective layer 122, the gate mask layer 102 is removed, and the top of the dummy gate structure 110 is exposed.

Therefore, the step of forming the gate opening 170 includes: removing the dummy gate structure 110 after forming the protective layer 122.

In some implementations, the dummy gate structure 110 is removed by a dry etching process, which is advantageous to improve the etching efficiency and the profile quality of the gate opening 170.

Figure 16:
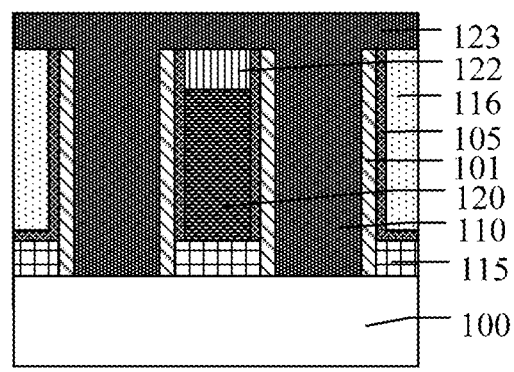
Figure 17:
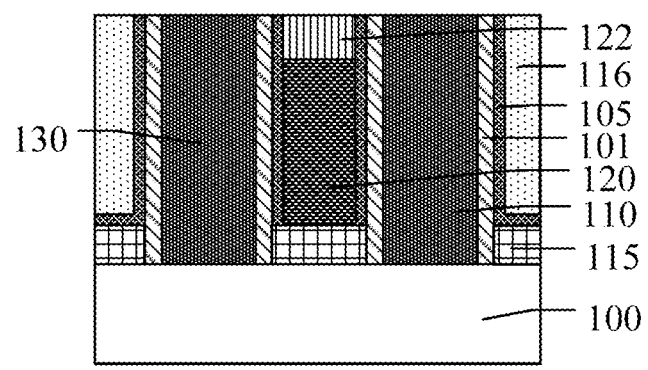

Referring to FIG. 16 and FIG. 17, a gate structure 130 (as shown in FIG. 17) is formed in the gate opening 170 (as shown in FIG. 15).

It can be seen from the foregoing that some implementations does not need to additionally perform the step of removing the gate structure of a partial thickness and the step of forming the protective layer on the top of the remaining gate structure, so it is unnecessary to form a gate structure having an excessively large height, which is advantageous to increase the process window for forming the gate structure 130.

The gate structure 130 is used to control the opening or closing of a conductive channel when the device is in operation.

In some implementations, the gate structure 130 is a metal gate structure. The gate structure 130 correspondingly includes a gate dielectric layer (not shown) on the bottom and sidewall of the gate opening 170, a work function layer (not shown) conformally covering the gate dielectric layer, and a gate electrode layer (not shown) located in the remaining gate opening 170 exposing the work function layer.

In some implementations, the gate dielectric layer includes a high-k dielectric layer, and the material of the gate dielectric layer is a high-k dielectric material, where the high-k dielectric material refers to a dielectric material having a relative dielectric constant greater than a relative dielectric constant of silicon oxide. Specifically, the material of the gate dielectric layer is $HfO_2$. In other implementations, the material of the gate dielectric layer may also be selected from $ZrO_2$, HfSiO, HfSiON, HfTaO, HfTiO, HfZrO or $Al_2O_3$.

In still other implementations, the gate dielectric layer may further include a gate oxide layer located on the bottom of the gate opening, and a high-k dielectric layer located on the top of the gate oxide layer and on the bottom and sidewall of the gate opening.

When an NMOS transistor is formed, the material of the work function layer includes one or more of titanium aluminide, tantalum carbide, aluminum, or titanium carbide. When a PMOS transistor is formed, the material of the work function layer includes one or more of titanium nitride, tantalum nitride, titanium carbide, silicon tantalum nitride, silicon titanium nitride, and tantalum carbide.

In some implementations, the material of the gate electrode layer is tungsten. In other implementations, the material of the gate electrode layer may also be a magnesium-tungsten alloy, Al, Cu, Ag, Au, Pt, Ni or Ti.

In some implementations, the step of forming the gate structure 130 includes the following steps:

As shown in FIG. 16, an initial gate structure 123 is formed and filled in the gate opening 170, the initial gate structure 123 also covering the dielectric layer 116 and the protective layer 122. As shown in FIG. 17, the initial gate structure 123 above the top of the protective layer 122 is removed by a planarization process, the remaining initial gate structure 123 located in the gate opening 170 serving as the gate structure 130.

In some implementations, the step of forming the initial gate structure 123 includes: forming an initial gate dielectric layer (not shown) to conformally cover the bottom and sidewall of the gate opening 170, the dielectric layer 116 and the top of the protective layer 122; and forming an initial work function layer (not shown) conformally covering the initial gate dielectric layer to form an initial gate electrode layer (not shown), where the initial gate electrode layer is filled in the remaining gate opening 170 exposed by the initial work function layer and covers the initial work function layer.

In some implementations, the process of forming the initial gate dielectric layer and an initial work function layer may be an atomic layer deposition process, which is advantageous to improve the conformal coverage capacity and thickness uniformity of the initial gate dielectric layer and the initial work function layer.

In some implementations, the process of forming the initial gate electrode layer may be a chemical vapor deposition process.

In some implementations, the planarization process of removing the initial gate structure 123 above the top of the protective layer 122 is a chemical mechanical grinding process.

Accordingly, the present disclosure also provides a semiconductor structure. Referring to FIG. 14, a schematic structural diagram of an embodiment of a semiconductor structure according to the present disclosure is shown.

The semiconductor structure includes: a base 100; a dummy gate structure 110, located on the base 100; a source/drain doping region 115, located in the base 100 on both sides of the dummy gate structure 110; a dielectric layer 116, located on the base 100 exposed by the dummy gate structure 110, the dielectric layer 116 exposing the top of the dummy gate structure 110; and a contact plug 120, located in the dielectric layer 116 on the top of the source/drain doping region 115, the contact plug 120 being electrically connected to the source/drain doping region 115.

In some implementations, the contact plug 120 is formed first, after a gate opening is formed by removing the dummy gate structure 110 subsequently and a gate structure is formed in the gate opening, the steps of removing the gate structure of a partial thickness and forming a protective layer on the top of the remaining gate structure are not required additionally, thereby facilitating simplification of the process complexity and reduction of the process difficulty. Moreover, the step of removing the gate structure of a partial thickness is eliminated, so that it is unnecessary to form a dummy gate structure 110 and a gate structure having an excessively large height. Accordingly, it is advantageous to increase the process windows for forming the dummy gate structure 110, removing the dummy gate structure 110 and subsequently forming the gate structure. In summary, in some implementations of the present disclosure, it is advantageous to simplify the process complexity and increase the process windows.

The base 100 is used to provide a process platform for processes.

In some implementations, the base 100 is used to form a planar field effect transistor, and the base 100 accordingly includes only a substrate (not marked). In other implementations, when the base is used to form a fin field effect transistor, the base accordingly includes a substrate and a fin that protrudes from the substrate.

In some implementations, the substrate is a silicon substrate. In other implementations, the material of the substrate may also be other materials such as germanium, silicon germanide, silicon carbide, gallium arsenide or indium gallide, and the substrate can also be other types of substrates such as a silicon substrate on an insulator or a germanium substrate on an insulator. The material of the substrate may be a material suitable for process requirements or easy to integrate.

The dummy gate structure 110 occupies a spatial position for subsequent formation of a gate structure.

In some implementations, the dummy gate structure 110 is a single-layer structure, the dummy gate structure 110 includes only a dummy gate layer (not marked), and the material of the dummy gate layer is polysilicon.

In other implementations, the dummy gate structure may be a stacked structure, where the dummy gate structure accordingly includes a dummy gate oxide layer and a dummy gate layer located on the dummy gate oxide layer, and the material of the dummy gate oxide layer may be silicon oxide or silicon oxynitride.

In some implementations, the semiconductor structure further includes: a side wall layer 101, located on a sidewall of the dummy gate structure 110. The side wall layer 101 is used to define a formation region of the source/drain doping region 115, and the side wall layer 101 is further used to protect the dummy gate structure 110 and the sidewall of the subsequently formed gate structure.

The material of the side wall layer 101 may be at least one of silicon oxide, silicon nitride, silicon oxynitride, silicon carbide, silicon oxycarbonitride, silicon oxycarbide, boron nitride or boron oxycarbide. The side wall layer 101 may be a single-layer structure or a stacked structure. In some implementations, the side wall layer 101 is a single-layer structure, and the material of the side wall layer 101 is silicon nitride.

The source/drain doping region 115 is located in the base 100 on both sides of the dummy gate structure 110.

When an NMOS transistor is formed, the source/drain doping region 115 includes a stress layer doped with an N-type ion, the material of the stress layer is Si or SiC, and the stress layer provides a tensile stress to a channel region of the NMOS transistor, thereby facilitating the increase of the carrier mobility of the NMOS transistor, where the N-type ion is a P ion, an As ion or an Sb ion.

When a PMOS transistor is formed, the source/drain doping region 115 includes a stress layer doped with a P-type ion, the material of the stress layer is Si or SiGe, and the stress layer provides a pressure stress to a channel region of the PMOS transistor, thereby facilitating the increase of the carrier mobility of the PMOS transistor, where the P-type ion is a B ion, a Ga ion or an In ion.

In some implementations, the semiconductor structure further includes: a contact etch stop layer 105, located on a sidewall of the side wall layer 101. The contact etch stop layer 105 is used to protect the top and sidewall of the dummy gate structure 110 as well as the source/drain doping region 115 in the step of forming the contact plug 120.

In some implementations, the material of the contact etch stop layer 105 is silicon nitride. The silicon nitride material has a relatively large density and hardness, so as to ensure that the contact etch stop layer 105 can achieve the functions of protecting the dummy gate structure 110 and the source/drain doping region 115.

In some implementations, the dielectric layer 116 covers the sidewall of the dummy gate structure 110.

The dielectric layer 116 is used to isolate adjacent devices, and the dielectric layer 116 also provides a process platform for forming a contact plug 120 and subsequently forming a gate structure.

Therefore, the material of the dielectric layer 116 is an insulating material such as one or more of silicon oxide, silicon nitride, silicon oxynitride, silicon oxycarbide, carbonitride and silicon oxycarbonitride. In some implementations, the material of the dielectric layer 116 is silicon oxide.

The contact plug 120 is used to achieve an electrical connection between the source/drain doping region 115 and an external circuit or other interconnect structures.

In some implementations, the material of the contact plug 120 is W. In other implementations, the material of the contact plug may also be Al, Cu or TiAl.

In some implementations, the top of the contact plug 120 is lower than the top of the dummy gate structure 110, so as to provide a process basis for forming a protective layer 122. Accordingly, the adjacent dummy gate structure 110 and the contact plug 120 define a groove 180 (as shown in FIG. 12).

In some implementations, the semiconductor structure further includes: a protective layer 122, located on the top of the contact plug 120.

The protective layer 122 is used to protect the top of the contact plug 120, so as to prevent loss of the contact plug 120 in the subsequent steps of removing the dummy gate structure 110 to form a gate opening and forming a gate structure in the gate opening, thereby being advantageous to prevent the contact plug 120 from bridging with the subsequent gate structure.

In some implementations, the protective layer 122 is located in the groove 180 (as shown in FIG. 12).

In some implementations, the material of the protective layer 122 is silicon oxide. Specifically, the material of the protective layer 122 may include tetraethoxysilane (TEOS) or flowable chemical vapor deposition (FCVD) silicon oxide.

Silicon oxide is a commonly used material in a semiconductor process, which is advantageous to improve process compatibility and achieve low process cost. The subsequent process generally further includes the step of etching the protective layer 122 to expose the contact plug 120. The etching process is easily performed by selecting silicon oxide.

It is to be noted that the thickness of the protective layer 122 should not be too small or too large. If the thickness of the protective layer 122 is too small, the protective layer 122 is easily consumed prematurely, thereby easily reducing the protective effect of the protective layer 122 on the contact plug 120. If the thickness of the protective layer 122 is too large, the method further subsequently includes the step of etching the protective layer 122 to expose the contact plug 120. The process of etching the protective layer 122 is difficult accordingly. Moreover, the thickness of the protective layer 122 is too large, and the height of the contact plug 120 will be too small accordingly, thereby easily affecting the performance of the contact plug 120. To this end, in the step of forming the protective layer 122 in some implementations, the protective layer 122 has a thickness of 150 A to 500 A.

Specifically, the top of the protective layer 122 is flush with the top of the dummy gate structure 110, thereby providing a planar surface for subsequent processes, and further improving the process stability of subsequent processes.

The semiconductor structure may be formed by the formation method according to the foregoing embodiment, or may also be formed by other formation methods. For a detailed description of the semiconductor structure in some implementations, reference may be made to the corresponding description in the foregoing embodiments, and the descriptions are omitted here in some implementations.

Although the present disclosure is disclosed above, the present disclosure is not limited thereto. A person skilled in the art can make various changes and modifications without departing from the spirit and scope of the present disclosure, and the scope of the present disclosure should be determined by the scope defined by the claims.

What is claimed is:

1. A method for forming a semiconductor structure, comprising:

providing a base, wherein a dummy gate structure is formed on the base, a source/drain doping region is formed in the base on both sides of the dummy gate structure, a dielectric layer is formed on the base exposed by the dummy gate structure, and the dielectric layer covers the source/drain doping region;

etching the dielectric layer on both sides of the dummy gate structure to form a contact hole exposing the source/drain doping region;

forming a contact plug in the contact hole, wherein the contact plug is electrically connected to the source/drain doping region and a top of the contact plug is lower than a top of the dummy gate structure;

after forming the contact plug, removing the dummy gate structure, and forming a protective layer on the top of the contact plug;

after forming the protective layer, forming a gate opening in the dielectric layer; and forming a gate structure in the gate opening.

2. The method for forming a semiconductor structure according to claim 1, wherein in the step of forming the protective layer, a top of the protective layer is flush with the top of the dummy gate structure.

3. The method for forming a semiconductor structure according to claim 2, wherein:

the step of forming the protective layer comprises:
    forming a protective material layer and filling in the remaining contact hole exposed by the contact plug; and
    removing the protective material layer above the top of the dummy gate structure using a planarization process, where the remaining protective material layer serves as the protective layer; and in the step of the planarization process, removing the dielectric layer above the top of the dummy gate structure, and exposing the top of the dummy gate structure.

4. The method for forming a semiconductor structure according to claim 3, wherein the protective material layer is formed using a spin process.

5. The method for forming a semiconductor structure according to claim 3, wherein the planarization process is a chemical mechanical grinding process or a dry etching process.

6. The method for forming a semiconductor structure according to claim 1, wherein:

in the step of providing the base, a gate mask layer is formed on the top of the dummy gate structure; and the step of forming the contact hole comprises: etching the dielectric layer on both sides of the dummy gate structure using the gate mask layer as an etch barrier layer through a self-aligned contact etching process.

7. The method for forming a semiconductor structure according to claim 6, wherein:

the step of forming the contact hole comprises: forming a pattern layer on the dielectric layer, wherein a pattern opening exposing a top of the dielectric layer above the source/drain doping region is formed in the pattern layer, and the pattern opening extends above a partial top of the gate mask layer in a direction perpendicular to a sidewall of the dummy gate structure; and etching the dielectric layer exposed by the pattern opening using the pattern layer as a mask.

8. The method for forming a semiconductor structure according to claim 6, wherein the material of the gate mask layer comprises at least one of silicon nitride, silicon carbide or silicon carbonitride.

9. The method for forming a semiconductor structure according to claim 1, wherein:

in the step of providing the base, the dielectric layer covers a top of the dummy gate structure, and the step of forming the contact plug comprises: forming a conductive layer filled in the contact hole, the conductive layer also covering a top of the dielectric layer;

removing the conductive layer above the top of the dielectric layer using a planarization process; and after the planarization process, etching back the remaining conductive layer of a partial thickness, and retaining the remaining conductive layer in the contact hole as the contact plug.

10. The method for forming a semiconductor structure according to claim 9, wherein the remaining conductive layer of a partial thickness is etched back using a dry etching process.

11. The method for forming a semiconductor structure according to claim 1, wherein the material of the protective layer comprises silicon oxide.

12. The method for forming a semiconductor structure according to claim 1, wherein in the step of forming the protective layer, the protective layer has a thickness of 150 Å to 500 Å.

13. The method for forming a semiconductor structure according to claim 1, wherein the dielectric layer on both sides of the dummy gate structure is etched using a dry etching process to form the contact hole.

* * * * *